(12) United States Patent
Kawabata

(10) Patent No.: US 7,634,370 B2
(45) Date of Patent: Dec. 15, 2009

(54) WAVEFORM INPUT CIRCUIT, WAVEFORM OBSERVATION UNIT AND SEMICONDUCTOR TEST APPARATUS

(75) Inventor: Masayuki Kawabata, Tokyo (JP)

(73) Assignee: Advantest Corp., Tokyo (JP)

(*) Notice: Subject to any disclaimer, the term of this patent is extended or adjusted under 35 U.S.C. 154(b) by 172 days.

(21) Appl. No.: 11/368,208

(22) Filed: Mar. 3, 2006

(65) Prior Publication Data

US 2007/0268012 A1 Nov. 22, 2007

(30) Foreign Application Priority Data

Mar. 4, 2005 (JP) ............................. 2005-060369

(51) Int. Cl.
*G01R 31/02* (2006.01)
(52) U.S. Cl. ........................................ 702/66; 324/763
(58) Field of Classification Search ............. 702/64–66, 702/117–118, 122; 324/537, 763–765
See application file for complete search history.

(56) References Cited

U.S. PATENT DOCUMENTS

| | | | | |
|---|---|---|---|---|
| 5,287,022 A * | 2/1994 | Wilsher | ...................... | 327/310 |
| 5,430,400 A * | 7/1995 | Herlein et al. | ............... | 327/108 |
| 6,275,023 B1 * | 8/2001 | Oosaki et al. | ............. | 324/158.1 |
| 6,396,329 B1 * | 5/2002 | Zerbe | .......................... | 327/336 |
| 6,621,321 B2 * | 9/2003 | Goldstein et al. | ............ | 327/321 |
| 7,248,058 B2 * | 7/2007 | Clarridge et al. | ............. | 324/601 |

FOREIGN PATENT DOCUMENTS

| | | |
|---|---|---|
| JP | 2-227680 | 9/1990 |
| JP | 2001-007660 | 1/2001 |

* cited by examiner

*Primary Examiner*—Eliseo Ramos Feliciano
*Assistant Examiner*—Mary C Baran
(74) *Attorney, Agent, or Firm*—Muramatsu & Associates

(57) ABSTRACT

A waveform input circuit, waveform observation unit and semiconductor test apparatus allow to faithfully observe waveform of a device under test with high output impedance and low load driving capability. A waveform input circuit includes a high input impedance terminating resistance which receives an input signal from a transmission line, a relay which selects a terminating resistance, an input buffer which is connected when the high input impedance terminating resistance is selected. A reference potential switch is further provided to select a reference potential of the transmission line where one reference potential is controlled to be in phase with the input signal by an input buffer which is connected when the high input impedance terminating resistance is selected.

5 Claims, 10 Drawing Sheets

FIG: 11
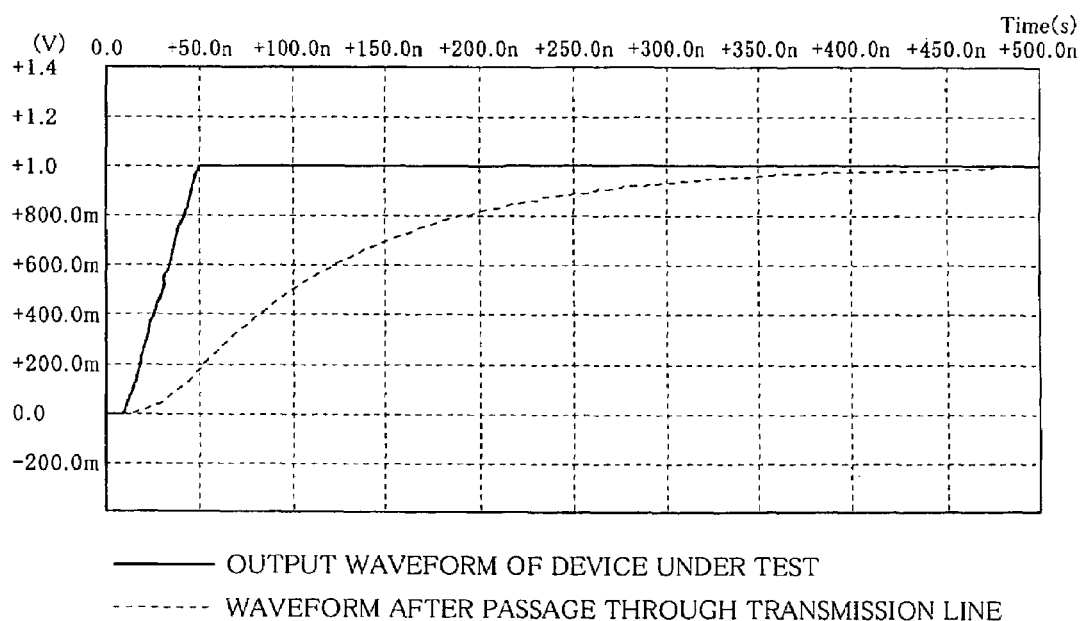
——— OUTPUT WAVEFORM OF DEVICE UNDER TEST
------ WAVEFORM AFTER PASSAGE THROUGH TRANSMISSION LINE

WAVEFORM INPUT CIRCUIT, WAVEFORM OBSERVATION UNIT AND SEMICONDUCTOR TEST APPARATUS

BACKGROUND OF THE INVENTION

1. Field of the Invention

The present invention relates to a waveform observation unit capable of observing an analog waveform output from a device under test, a waveform input circuit corresponding to an input section of the waveform observation unit, and a semiconductor test apparatus comprising the waveform observation unit. More particularly, it relates to a waveform input circuit, a waveform observation unit and a semiconductor test apparatus suitable for enabling faithful observation of an output waveform of even a device under test which is not capable of driving a transmission line because of high output impedance and low load driving capability.

2. Description of the Related Art

Some semiconductor test apparatuses for which a device under test (DUT) is a semiconductor integrated circuit such as an IC or LSI comprise a waveform observation unit to observe an analog waveform output from the device under test (e.g., refer to Japanese Patent Publication Laid-open No. 2001-007660).

Here, a circuit configuration of a conventional waveform observation unit is shown in FIG. 8.

As shown in this drawing, a waveform observation unit 100 comprises a waveform input circuit 110, a low pass filter 120, a clock generator 130, an A/D converter 140, a waveform acquisition memory 150 and a trigger generator 160.

In this arrangement, the waveform input circuit 110 receives an output waveform from a device under test 200, and then sends it to the low pass filter 120. The low pass filter 120 is an A/D converter prefilter provided to restrict the band of an analytic analog signal within Nyquist frequency. The A/D converter 140 samples the analog signal synchronously with a clock supplied from the clock generator 130, and converts it into a digital signal. The waveform acquisition memory 150 receives the digital signal (data) from the A/D converter 140 synchronously with the clock from the clock generator 130. The trigger generator 160 provides an observation timing signal to the waveform acquisition memory 150, and controls a recording time range of the data.

It is to be noted that in the semiconductor test apparatus, the waveform observation unit 100 is provided in a system LSI tester, and the device under test 200 is provided in a test board (see FIG. 10).

Furthermore, there is shown in FIG. 9 a circuit configuration of a waveform input circuit which is an input section of the waveform observation unit.

As shown in this drawing, a waveform input circuit 110a comprises a transmission line (input signal transmission line) 111 through which an output waveform from the device under test 200 is transmitted, a terminating resistance 50Ω, a terminating resistance 1 MΩ (Hi impedance), a relay (selection means) 112 which selects any one of the terminating resistances, and a Hi impedance input amplifier 113.

In this conventional waveform input circuit 110a, the relay 112 can be controlled to select from the terminating input 50Ω corresponding to the impedance of the transmission line 111 and the Hi impedance (1 MΩ in FIG. 9) terminating input which reduces a load current of the device under test 200.

Furthermore, a DC measurement interrupt path 114 is connected to the waveform input circuit 110a. This DC measurement interrupt path 114 is a path connected in addition to paths for waveform observation to check whether or not electrical connections within the device under test 200 is good. The DC measurement interrupt path 114 applies a voltage to the device under test 200 to perform DC-measurement to see whether or not there is a leakage of a minute electric current.

On the other hand, in the waveform observation unit 100 as shown in FIG. 8, it is preferable that the output signal waveform from the device under test 200 can be faithfully observed.

To this end, a cable with a characteristic impedance of 50Ω is used for the transmission line 111 from the device under test 200 to the waveform observation unit 100 to obtain a good high-frequency transmission characteristic. Moreover, a printed board signal wiring line pattern inside the waveform observation unit 100 is designed to have as low stray capacitance as possible so as to achieve an ideal 50Ω transmission line.

However, some devices under test can not drive the transmission line because of high output impedance and low load driving capability, so that there has been a problem that an output waveform from the device under test can not be faithfully observed by the conventional waveform observation unit in some cases.

Here, for example, there has heretofore been means for solving such a problem, wherein a switch is turned to the terminating resistance 1 MΩ (Hi impedance terminating input) as shown in FIG. 9.

For example, impedance matching of the device under test, the waveform observation unit and the transmission line therebetween is important to faithfully observe a broadband waveform, and thus, in a case of a device with the sufficient load driving capability, the waveform is observed with a 50Ω termination on the side of the waveform observation unit. On the contrary, in a case of a device with high output impedance and low load driving capability, it is necessary to receive a signal at high impedance on the side of the waveform observation unit (Hi impedance terminating input), thereby reducing a load current for observation of the waveform.

Furthermore, another solving means has heretofore been proposed wherein a Hi impedance input amplifier (a buffer circuit with high load current driving capability) 300 is additionally connected in the close vicinity of the device under test 200, as shown in FIG. 10.

In such a circuit configuration, a load driving circuit such as the Hi impedance input amplifier 300 can drive the transmission line 111.

However, the following problems have occurred in the above solving means.

First, in the waveform input circuit shown in FIG. 9, when the output impedance of the device under test is high, not only input stray capacitance of the waveform observation unit but also the transmission line behaves as capacity. Thus, a problem arises wherein the rising edge of the device output waveform becomes dull (the rising edge delays) since the output waveform has to charge the capacitance including the transmission line.

One example of measurement results of this device output waveform is shown in FIG. 11. This drawing is a graph showing the measurement result of the output waveform (thick full line) of the device under test in comparison with the measurement result of the waveform (thin dotted line) after the passage through the transmission line. As shown, the waveform after the passage through the transmission line is dull.

It is to be noted that in connection with FIG. 11, the transmission line has a characteristic impedance of 50Ω, a length of 1 m and an input capacity of 100 pF, and when output impedance is 1 kΩ, a signal observation band is 1.6 MHz.

Furthermore, the configuration shown in FIG. 10 is not desirable in that if circuits are added in the vicinity of the device under test 200, a design cost for the test board is increased, and problems are caused in reliability and maintainability.

However, on the test board, there is needed another path which directly connects the device under test 200 and the transmission line 111, in addition to the Hi impedance input amplifier 300. This path is used for measurement using the DC measurement interrupt path 114 provided on the side of the system LSI tester.

SUMMARY OF THE INVENTION

The present invention has been made in view of the problems described above, and is directed to provide a waveform input circuit, a waveform observation unit and a semiconductor test apparatus which enable faithful observation of an output waveform of a device under test without adding a load driving circuit immediately after the device under test when observing the output waveform of the device under test which is not capable of driving a transmission line because of high output impedance and low load driving capability.

To achieve this object, a waveform input circuit of the present invention to which a signal from a device under test is input via an input signal transmission line comprises: a high input impedance terminating resistance which receives the signal from the input signal transmission line as an input signal; selection means for selecting one of two or more terminating resistances including the high input impedance terminating resistance; an input buffer which is connected when the high input impedance terminating resistance is selected in the selection means; and switch means for switching a reference potential of the input signal transmission line to at least two kinds of different potentials, wherein one reference potential which is switched by the switch means is an in phase potential which is a potential controlled to be in phase with the input signal by an output voltage of the input buffer which is connected when the high input impedance terminating resistance is selected in the selection means.

In the waveform input circuit configured as noted above, the reference potential of the input signal transmission line will be the potential controlled to be in phase with the input signal owing to the output voltage of the input buffer which is connected when the high input impedance terminating resistance is selected in the selection means (e.g., a relay), thereby making it possible to reduce the capacity between an input signal terminal and an envelop of the transmission line, and suppress the dullness of the device output waveform to achieve a faster response to the signal. Therefore, it is possible to faithfully observe an output waveform of a device under test without adding a load driving circuit immediately after the device under test when observing the output waveform of the device under test which is not capable of driving the transmission line because of high output impedance and low load driving capability.

Furthermore, the waveform input circuit of the present invention comprises a DC measurement interrupt path to be connected to perform a DC measurement, and one reference potential which is switched by the switch means is a guard potential which is a potential at a guard line of the DC measurement interrupt path.

Since the waveform input circuit has such a configuration, the switch means switches the reference potential of the input signal transmission line so that it becomes the guard potential, thereby allowing the prevention of a leakage in the transmission line.

Furthermore, the waveform input circuit of the present invention comprises a plurality of input signal transmission lines, and the switch means switches the reference potentials of some of the input signal transmission lines to at least two kinds of different potentials.

In the waveform input circuit configured as noted above, the transmission lines are properly used depending on whether or not the device under test has the load driving capability, thus allowing the device output waveform to be faithfully observed.

Furthermore, the waveform input circuit of the present invention comprises an envelope drive amplifier which provides a voltage to the envelope of the input signal transmission line, when the switch means switches one reference potential to the in phase potential.

In the waveform input circuit configured as noted above, the gain of the envelope drive amplifier can be changed to control the degree of improvement of a frequency characteristic.

Furthermore, a waveform observation unit of the present invention comprises: a waveform input circuit to which an analog waveform output from a device under test is input; an A/D converter which converts the analog waveform into digital data; and a waveform acquisition memory which records the digital data, wherein the waveform input circuit is configured in the manner described above.

In the waveform observation unit configured as noted above, the waveform input circuit is provided in the manner described above, thereby making it possible to faithfully observe the analog waveform output from the device under test with low load driving capability.

Furthermore, a semiconductor test apparatus of the present invention comprises a waveform observation unit to observe an analog waveform output from a device under test, wherein the waveform observation unit is configured in the manner described above.

In the semiconductor test apparatus configured as noted above, the waveform observation unit is provided in the manner described above, so that even when a device under test is not capable of driving the transmission line because of high output impedance and low load driving capability, the device output waveform can be faithfully observed in the waveform observation unit.

As described above, according to the present invention, if the switch means provided in the waveform input circuit is switched, the reference potential of the input signal transmission line can be the potential controlled to be in phase with the input signal owing to the output voltage of the input buffer which is connected when the high input impedance terminating resistance is selected in the selection means. Thus, it is possible to reduce the capacity between the input signal terminal and the envelope of the transmission line, and suppress the dullness of the device output waveform to achieve a faster response to the signal.

Therefore, it is possible to faithfully observe an output waveform of a device under test without adding a load driving circuit immediately after the device under test when observing the output waveform of the device under test which is not capable of driving a transmission line because of high output impedance and low load driving capability.

Furthermore, since there is no need to add circuits in the vicinity of the device under test, a design cost for a test board can be reduced, and problems in reliability and maintainability can be solved. Moreover, it is also possible to avoid a problem that the DC measurement by the DC measurement interrupt path can not be performed.

BRIEF DESCRIPTION OF THE DRAWINGS

FIG. 11 is a graph showing a device output waveform and a waveform after the passage through a transmission line in the waveform input circuit in FIG. 9.

DETAILED DESCRIPTION OF THE PREFERRED EMBODIMENTS

Preferred embodiments of a waveform input circuit, a waveform observation unit and a semiconductor test apparatus according to the present invention will hereinafter be described with reference to the drawings.

First Embodiment

A first embodiment of a waveform input circuit of the present invention will first be described referring to FIG. 1.

Figure 1:
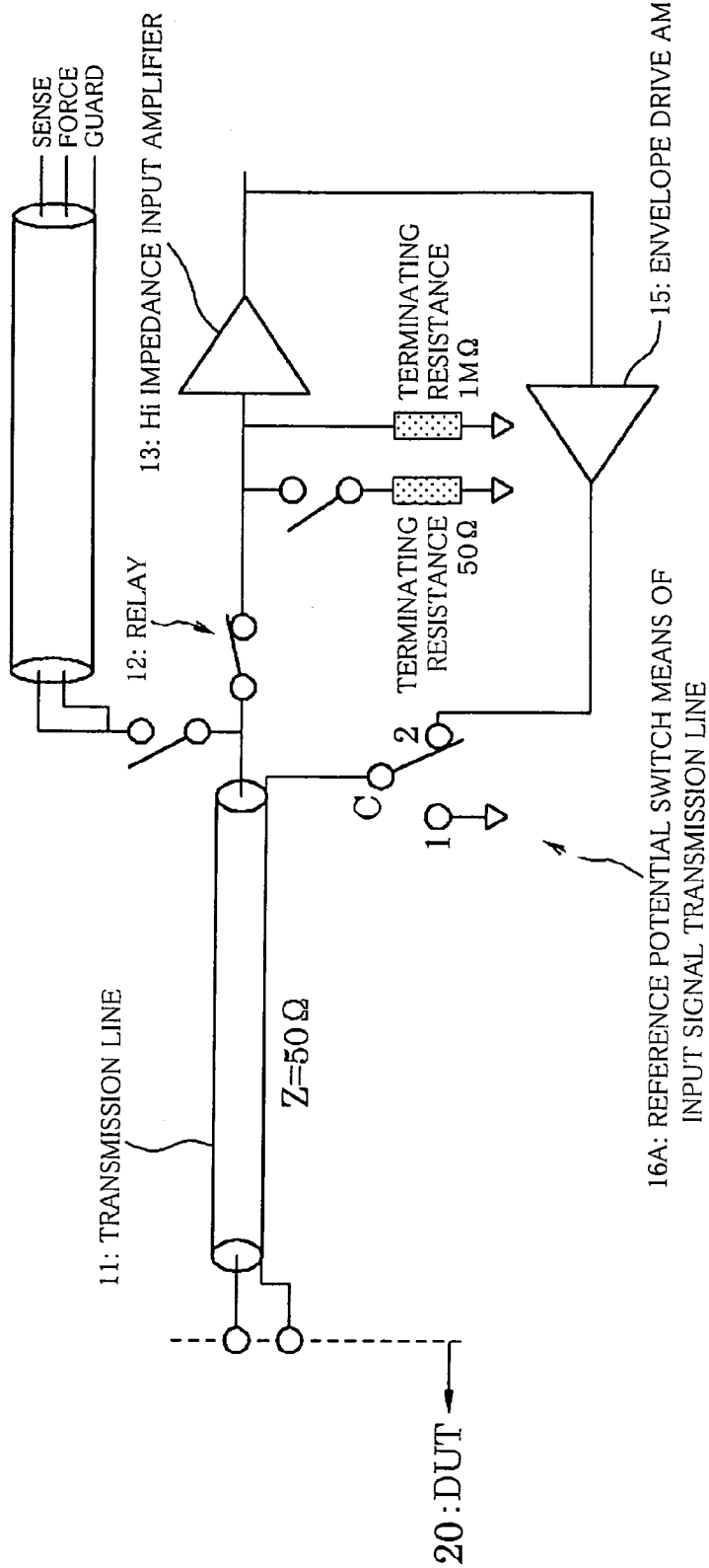
FIG. 1 is a circuit configuration diagram showing the configuration of a waveform input circuit in a first embodiment of the present invention.

FIG. 1 is a circuit configuration diagram showing the configuration of the waveform input circuit in the present embodiment.

It is to be noted that the waveform input circuit in the present embodiment is a circuit provided as an input section of a waveform observation unit. Further, the waveform observation unit is a test unit provided in a semiconductor test apparatus to observe an analog output waveform of a device under test.

As shown in FIG. 1, a waveform input circuit 10a comprises a transmission line (input signal transmission line) 11 on which an output waveform from a device under test (DUT) 20 is transmitted, a terminating resistance 50Ω, a terminating resistance 1 MΩ (Hi impedance), a relay (selection means) 12 which selects any one of the terminating resistances, a Hi impedance input amplifier (input buffer) 13, and a DC measurement interrupt path 14, as well as an envelope drive amplifier 15 and reference potential switch means 16a of the input signal transmission line.

Figure 9:
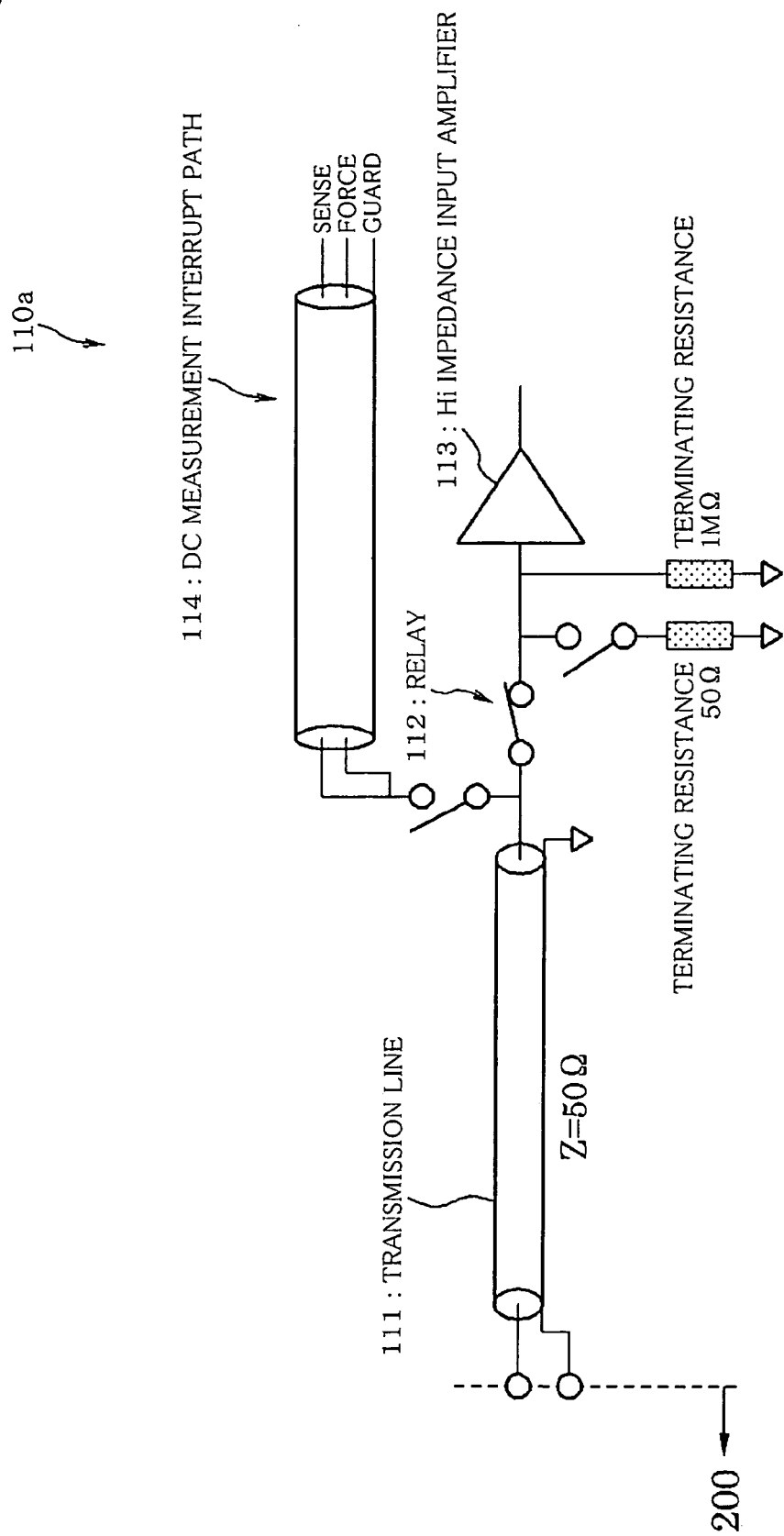
FIG. 9 is a circuit configuration diagram showing the configuration of a conventional waveform input circuit.
Figure 10:
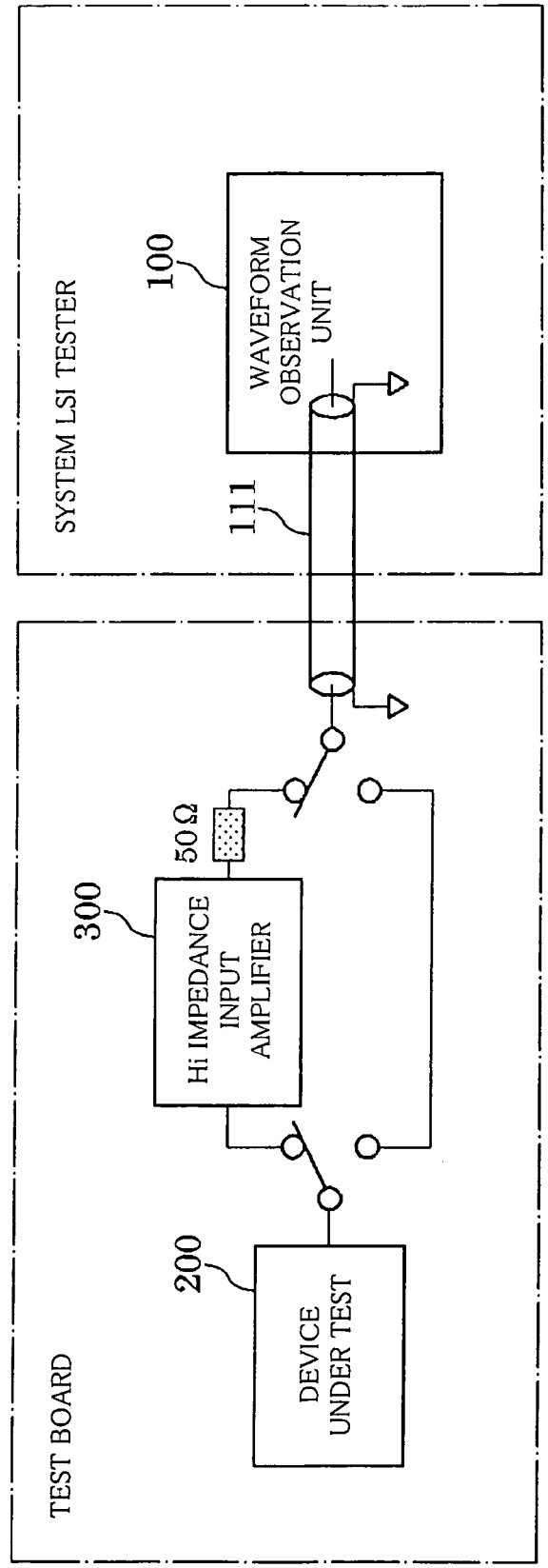
FIG. 10 is a block diagram showing the configuration of a conventional semiconductor test apparatus.

It is to be noted that the transmission line 11, the terminating resistance 50Ω, the terminating resistance 1 MΩ, the relay 12, the Hi impedance input amplifier 13 and the DC measurement interrupt path 14 have functions similar to those of the transmission line 111, the terminating resistance 50Ω, the terminating resistance 1 MΩ, the relay 112, the Hi impedance input amplifier 113 and the DC measurement interrupt path 114 which are shown in FIG. 9, and therefore, they will not be described here.

The envelope drive amplifier 15 has its input side connected to an output side of the Hi impedance input amplifier 13 and its output side connected to a selection terminal 2 (described later) of the reference potential switch means 16a of the input signal transmission line. This envelope drive amplifier 15 serves to provide a voltage to an envelope of the transmission line 11, and the gain of the envelope drive amplifier 15 can be changed to control the degree of improvement of a frequency characteristic.

The reference potential switch means (switch means) 16a of the input signal transmission line can be configured by, for example, a three-way switch; in which a common terminal C is connected to the envelope of the transmission line 11, a selection terminal 1 is connected to a GND, and a selection terminal 2 is connected to an output side of the envelope drive amplifier 15. It is to be noted that, to be specific, the reference potential switch means 16a of the input signal transmission line can be configured by use of, for example, a relay or semiconductor switch.

If the switching is performed in the reference potential switch means 16a of the input signal transmission line, the reference potential of the transmission line 11 can be switched to two kinds of different potentials.

For example, when the switch is turned to the selection terminal 1, the reference potential of the transmission line 11 becomes a ground potential (GND). When the switch is turned to the selection terminal 2, the reference potential of the transmission line 11 becomes an in phase potential which is a potential controlled to be in phase with the input signal by an output voltage of the input buffer (Hi impedance input amplifier) 13 which is connected when the high input impedance terminating resistance (1 MΩ) is selected in the selection means (relay) 12.

Here, there will be described referring to FIGS. 2 and 3 the circuit configuration of the waveform input circuit when the reference potential switch means 16a of the input signal transmission line is switched to the selection terminal 2, in comparison with the circuit configuration of a conventional waveform input circuit which does not comprise the reference potential switch means 16a of the input signal transmission line.

Figure 2:
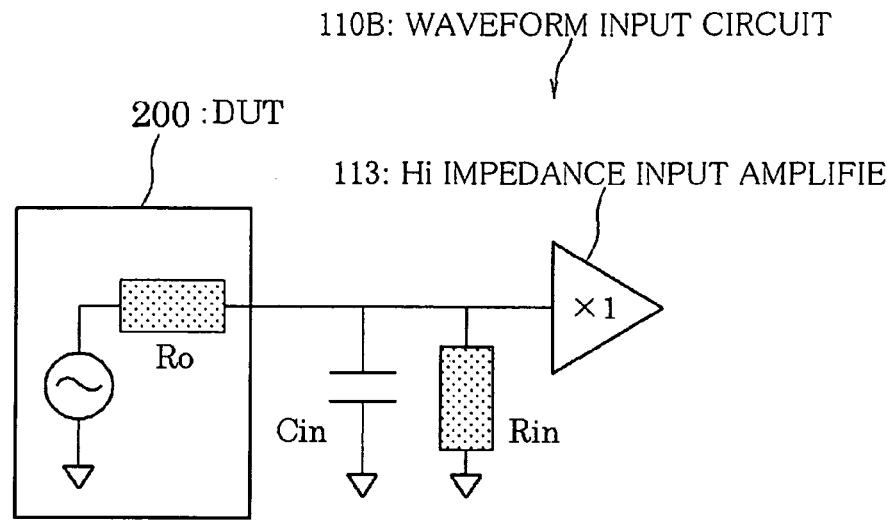
FIG. 2 is a circuit configuration diagram showing a simple configuration of a conventional waveform input circuit.
Figure 3:
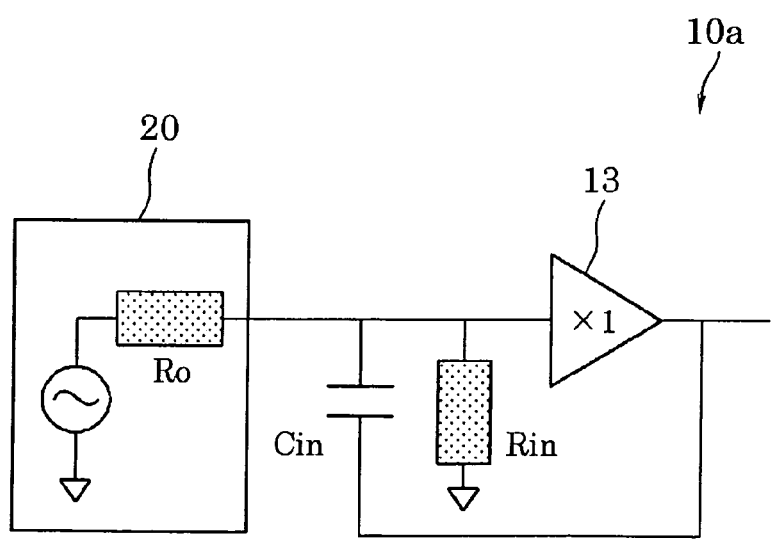
FIG. 3 is a circuit configuration diagram showing a simple configuration of the waveform input circuit in the first embodiment of the present invention.

FIG. 2 shows the configuration of the conventional waveform input circuit, and FIG. 3 shows the configuration of the waveform input circuit when the reference potential switch means 16a of the input signal transmission line is switched to the selection terminal 2. It is to be noted that in FIGS. 2 and 3, Ro indicates an output impedance of the device under test (20) 200, Cin indicates stray capacitance of the transmission line 11, and Rin indicates high output impedance. Moreover, the output impedance Ro is high impedance.

Here, in FIG. 2, an impedance value of the output impedance Ro of the device under test 200 is high, and, in a cable, there is a capacity between an input signal terminal (not shown) and an envelope of the cable, and the capacity behaves as Cin, so that a time constant Ro×Cin results in a dull waveform provided that Rin>>Ro (FIG. 11).

On the contrary, in FIG. 3, the capacitance Cin is connected to the output side of the Hi impedance input amplifier 13, so that when the product of the gain of the Hi impedance input amplifier 13 and the gain of the envelope drive amplifier 15 is 1.0, voltages at both ends of the capacitance Cin become equal. Thus, charge storage into the capacitance Cin is restrained, the dullness of the waveform is eliminated, and the response to a signal becomes faster.

Figure 4:
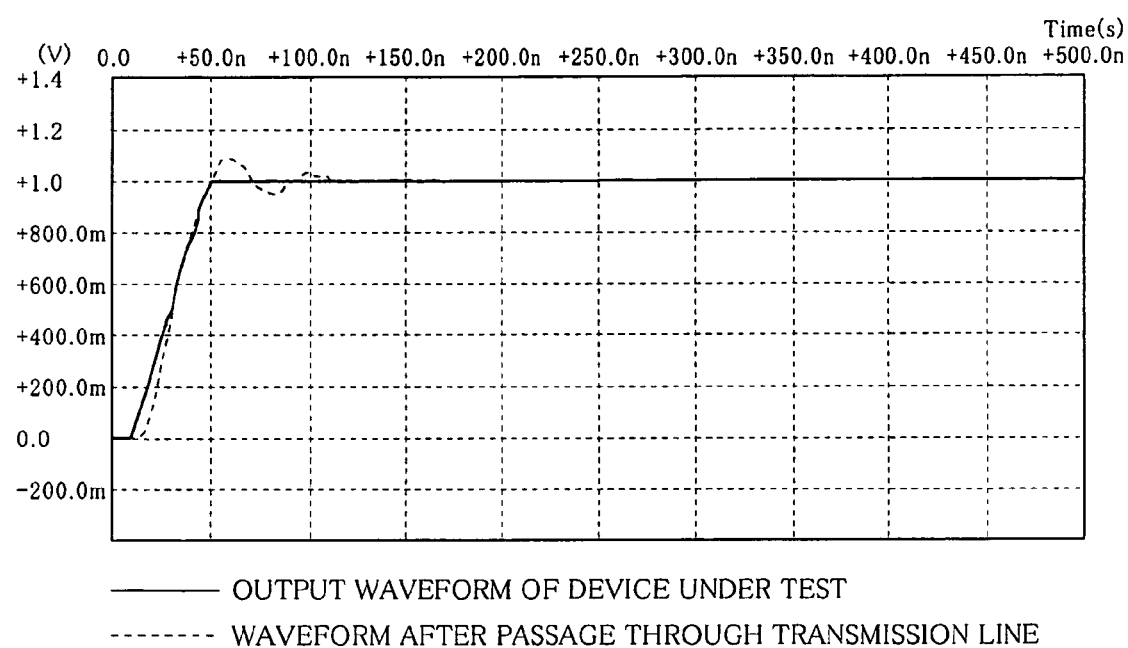
FIG. 4 is a graph showing a device output waveform and a waveform after the passage through a transmission line in the waveform input circuit in FIG. 1.

Furthermore, one example of measurement results of the device output waveform in the waveform input circuit of the present embodiment is shown in FIG. 4. FIG. 4 is a graph showing an output waveform (thick full line) of the device under test 20 supplied to the input of the waveform input circuit 10a shown in FIG. 1 in comparison with a waveform (thin dotted line) after the passage through the transmission line 11. As understood from the comparison between this graph and the graph shown in FIG. 11, the dullness in the waveform after the passage through the transmission line is minimized.

As described above, according to the waveform input circuit of the present embodiment, the charge storage into the capacitance Cin is restrained and the dullness of the waveform is thus eliminated, such that it is possible to faithfully observe an output waveform of a device under test without adding a load driving circuit immediately after the device under test when observing the output waveform of the device under test which is not capable of driving a transmission line because of high output impedance and low load driving capability.

Second Embodiment

Next, a second embodiment of a waveform input circuit of the present invention will be described with reference to FIGS. 5 and 6.

Figure 5:
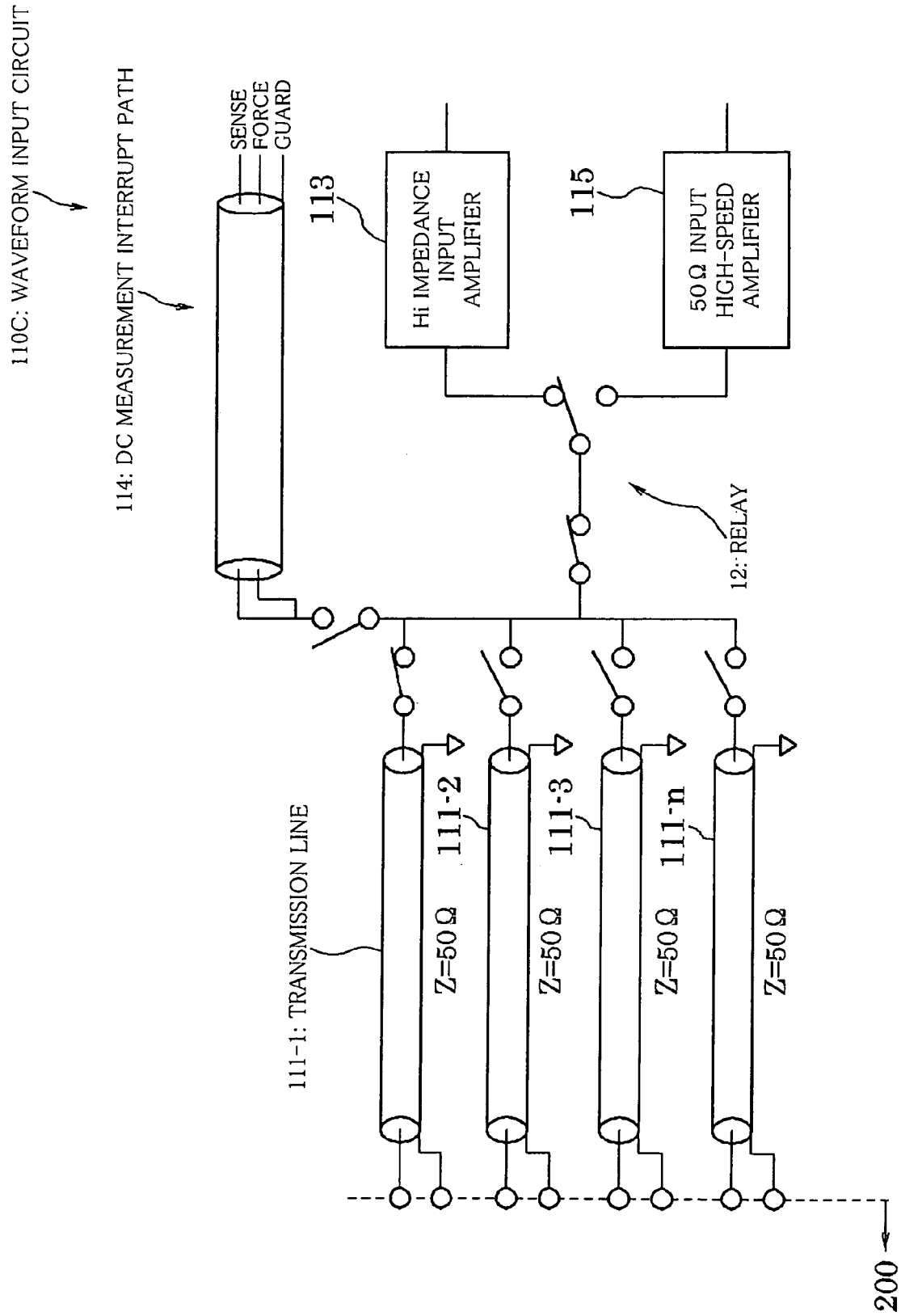
FIG. 5 is a circuit configuration diagram showing the configuration of a conventional waveform input circuit comprising a plurality of transmission lines.
Figure 6:
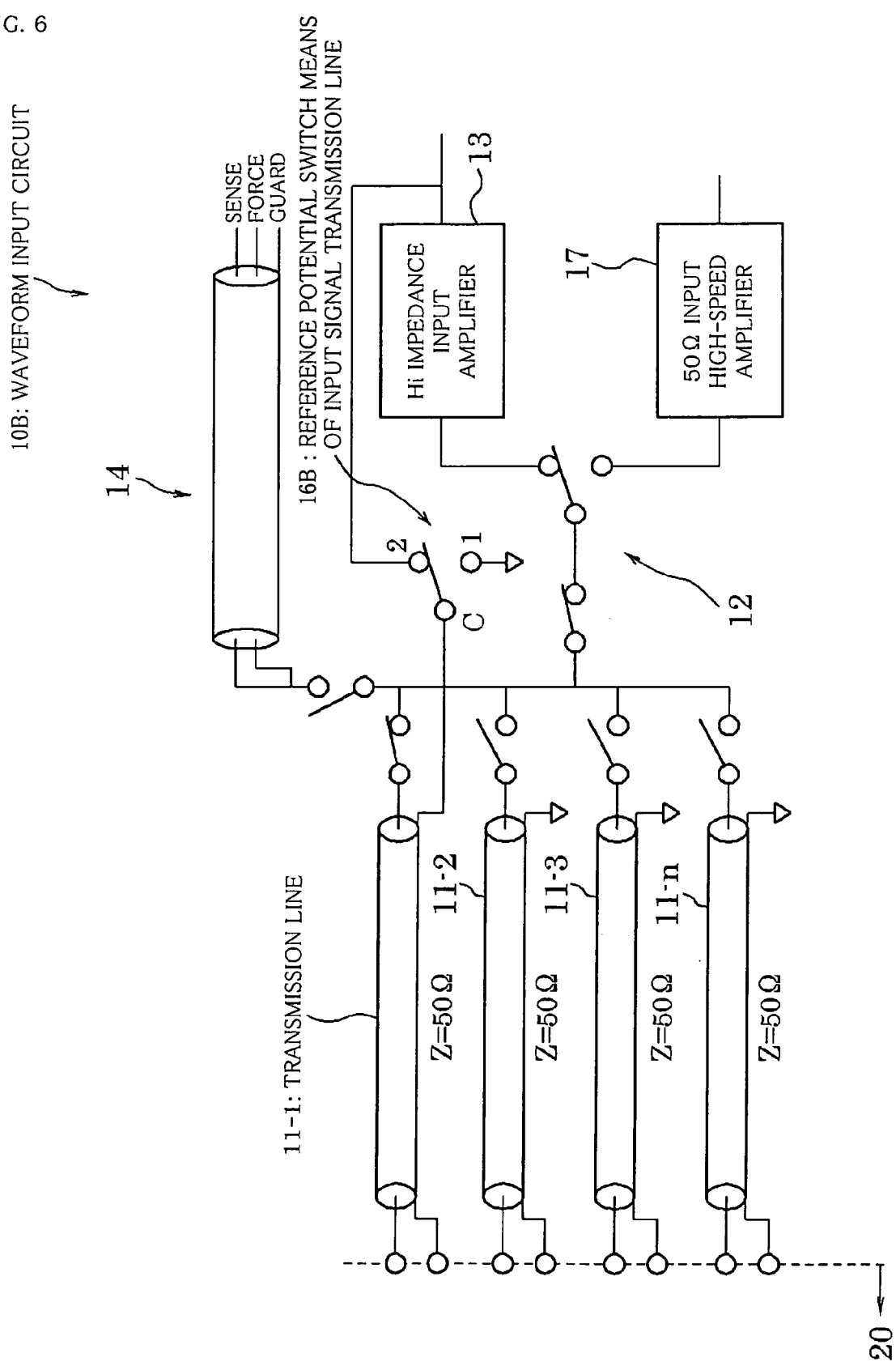
FIG. 6 is a circuit configuration diagram showing the configuration of a waveform input circuit comprising a plurality of transmission lines in a second embodiment of the present invention.

FIG. 5 shows the configuration of a conventional waveform input circuit comprising a plurality of transmission lines, and FIG. 6 shows the configuration of the waveform input circuit in the present embodiment.

The present embodiment is different from the first embodiment in that when a plurality of transmission lines is provided, the reference potential of one or two or more of the plurality of transmission lines can be switched by reference potential switch means of the input signal transmission lines. Other components are similar to those in the first embodiment.

Therefore, in FIG. 6, the same signs are assigned to the components similar to those in FIG. 1, and they will not be described in detail.

As shown in FIG. 5, a conventional waveform input circuit 110c has a configuration in which there is provided a plurality of transmission lines 111 (transmission lines 111-1 to 111-n) which are switched by a relay 112. A device under test 200 to be measured by a conventional waveform observation unit 100 includes not only a device under test with high output impedance and insufficient capability to drive the transmission lines but also a device under test with the capability to drive the transmission lines. Here, for the former device under test 200, reference potential switch means 16 of the input signal transmission line and the envelope drive amplifier 15 shown in FIG. 1 can be provided to suppress the dullness in a waveform, but for the latter device under test 200, it is not necessary to consider capacity Cin as shown in FIG. 2, and there may not be need for the reference potential switch means 16 of the input signal transmission line and the like.

Thus, as shown in FIG. 6, it is also possible to have a configuration in which the reference potential switch means 16 of the input signal transmission lines is only connected to an envelope of one (or two or more) of a plurality of transmission lines 11-1 to 11-n.

Specifically, for example, as shown in FIG. 6, it is possible to connect reference potential switch means 16b of the input signal transmission lines only to an envelope of the transmission line 11-1 without connecting the reference potential switch means 16b of the input signal transmission lines to envelopes of the other transmission lines 11-2 to 11-n.

Here, in the reference potential switch means 16b of the input signal transmission lines, a common terminal C is connected to the envelope of the transmission line 11-1, a selection terminal 1 is connected to a GND, and a selection terminal 2 is connected to an output side of a Hi impedance input amplifier 13.

Thus, for example, when the reference potential switch means 16b of the input signal transmission lines is switched to the selection terminal 1, the reference potential of the transmission line 11-1 becomes the ground potential (GND). When it is switched to the selection terminal 2, the reference potential of the transmission line 11-1 becomes the in phase potential which is, as noted above, a potential controlled to be in phase with the input signal by an output voltage of the input buffer (Hi impedance input amplifier) 13 which is connected when the high input impedance terminating resistance (1 MΩ) is selected in the selection means (relay) 12.

Furthermore, in a waveform input circuit 10b of the present embodiment, a 50Ω input high-speed amplifier 17 is switchably connected via the relay 12.

Figure 7:
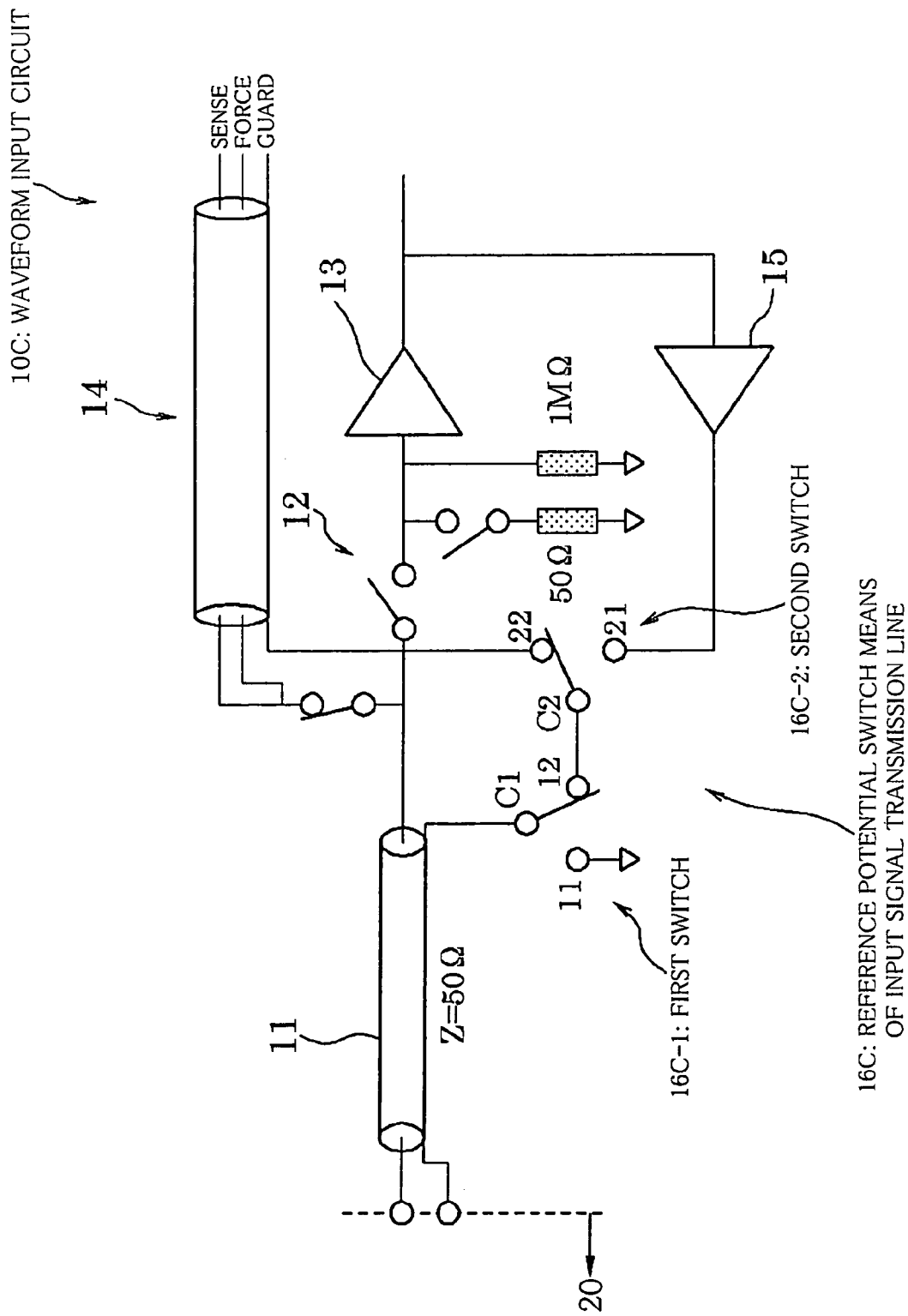
FIG. 7 is a circuit configuration diagram showing the configuration of a waveform input circuit in a third embodiment of the present invention.
Figure 8:
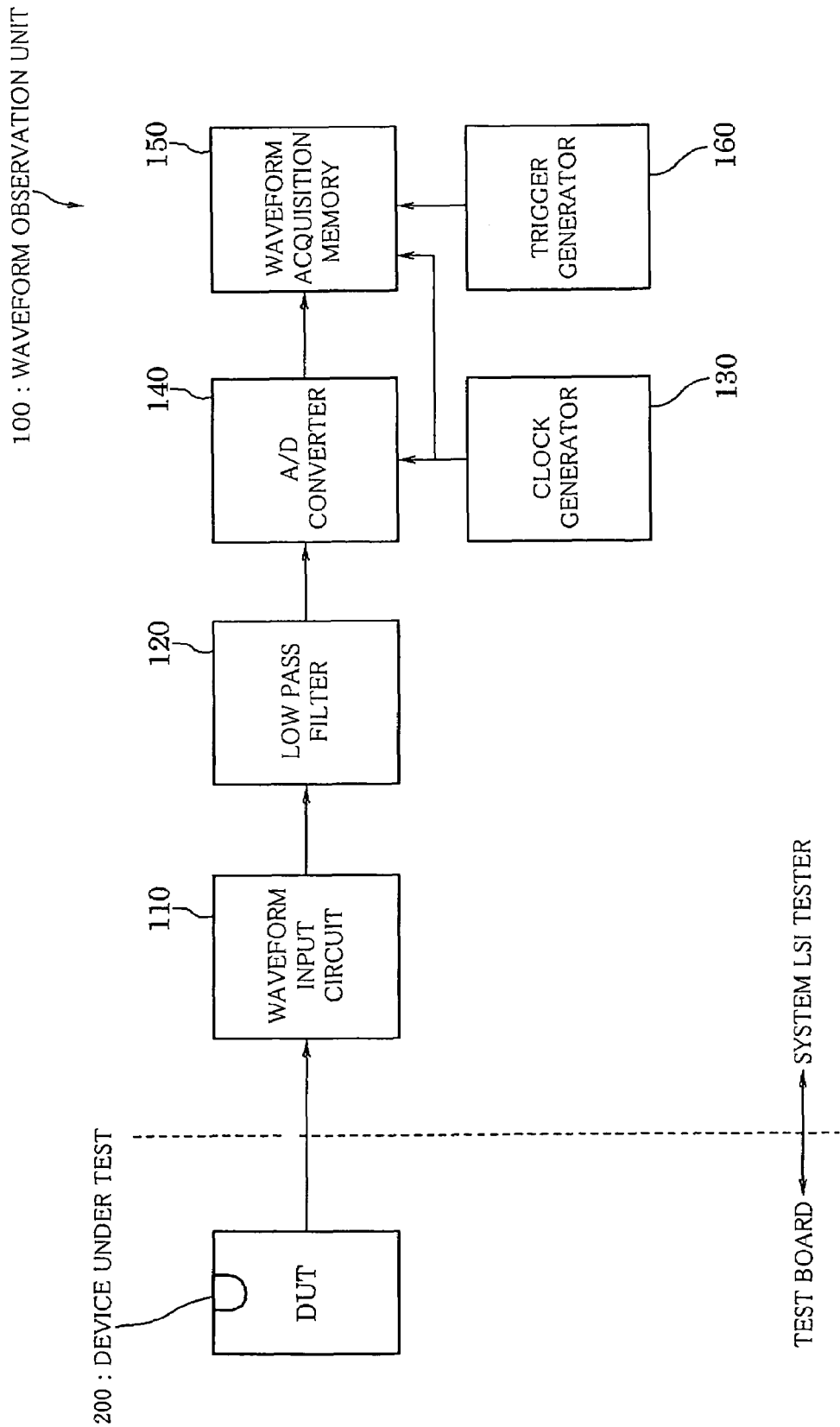
FIG. 8 is a block diagram showing the configuration of a conventional waveform observation unit.

There is difficulty in realizing an amplifier which is able to handle a high-speed signal and which has a Hi impedance input, so that in FIGS. 7 and 9 in which a 50Ω resistance is switched before the amplifier 13 for termination, this amplifier may limit the transmission performance of the high-speed signal. Thus, if two kinds of amplifiers are installed as in FIGS. 5 and 6, performance can be improved for specific use.

According to such a configuration, when a device under test 20 whose waveform may conceivably be dull is measured, the switch is turned by relay control to the transmission line 11-1 to which the reference potential switch means 16b of the input signal transmission lines is connected. Further, the reference potential switch means 16b of the input signal transmission lines is switched to the selection terminal 2. This makes it possible to suppress the dullness in the output waveform of the device under test 20 and achieve a faster response to the signal.

It is to be noted that in the configuration in FIG. 6, the output side of the Hi impedance input amplifier 13 is directly connected to the selection terminal 2 of the reference potential switch means 16b of the input signal transmission lines, but it is also possible to have a configuration in which an envelope drive amplifier such as shown in FIG. 1 is connected therebetween.

Third Embodiment

Next, a third embodiment of a waveform input circuit of the present invention will be described with reference to FIG. 7.

FIG. 7 is a circuit configuration diagram showing the configuration of the waveform input circuit in the present embodiment.

The present embodiment is different from the first embodiment in that reference potential switch means of the input signal transmission line can select a guard potential which is a potential at a guard line of a DC measurement interrupt path. Other components are similar to those in the first embodiment.

Therefore, in FIG. 7, the same signs are assigned to the components similar to those in FIG. 1, and they will not be described in detail.

As shown in FIG. 7, a waveform input circuit 10c; of the present embodiment comprises a transmission line 11, a terminating resistance 50Ω, a terminating resistance 1 MΩ, a relay 12, a Hi impedance input amplifier 13 and a DC measurement interrupt path 14, as well as an envelope drive amplifier 15 and reference potential switch means 16c of the input signal transmission line.

It is to be noted that the transmission line 11, the terminating resistance 50Ω, the terminating resistance 1 MΩ, the relay 12, the Hi impedance input amplifier 13, the DC measurement interrupt path 14 and the envelope drive amplifier 15 have functions similar to those of the transmission line 11, the terminating resistance 50Ω, the terminating resistance 1 MΩ, the relay 12, the Hi impedance input amplifier 13, the DC measurement interrupt path 14 and the envelope drive amplifier 15 which are shown in FIG. 1, and therefore, they will not be described here.

The reference potential switch means 16c of the input signal transmission line has a function of switching the reference potential of the transmission line 11 to three kinds of different potentials. The reference potential can be switched to the ground potential, the in phase potential which is, as noted above, a potential controlled to be in phase with an input signal by an output voltage of the input buffer (Hi impedance input amplifier) 13 which is connected when the high input impedance terminating resistance (1 MΩ) is selected in the selection means (relay) 12'', and the guard potential which is, as noted above, a potential at the guard line of the DC measurement interrupt path 14.

Specifically, the reference potential switch means 16c of the input signal transmission line is configured by a combination of two three-way switches, as shown in FIG. 7. In a first switch 16c-1 of the above switches, a common terminal C is connected to the envelope of the transmission line 11, a selection terminal 11 is connected to the GND, and a selection terminal 12 is connected to a common terminal C2 of a second switch 16c-2. Further, a selection terminal 21 of the second switch 16c-2 is connected to an output side of the envelope drive amplifier 15, and a selection terminal 22 thereof is connected to the guard line of the DC measurement interrupt path 14.

In the reference potential switch means 16c of the input signal transmission line having such a configuration, if the first switch 16c-1 is switched to the selection terminal 11, the reference potential of the transmission line 11 is set to the ground potential. Further, if the first switch 16c-1 is switched to the selection terminal 12 and the second switch 16c-2 is switched to the selection terminal 21, the reference potential of the transmission line 11 is set to the in phase potential, i.e., the potential controlled to be in phase with the input signal by the output voltage of the input buffer (Hi impedance input amplifier) 13 which is connected when the high input impedance terminating resistance (1 MΩ) is selected in the selection means (relay) 12. Still further, if the first switch 16c-1 is switched to the selection terminal 12 and the second switch 16c-2 is switched to the selection terminal 22, the reference potential of the transmission line 11 is set to the guard potential, i.e., the potential at the guard line of the DC measurement interrupt path 14.

Among the above, when the reference potential of the transmission line 11 is set to the in phase potential, i.e., the potential controlled to be in phase with the input signal by the output voltage of the input buffer (Hi impedance input amplifier) 13 which is connected when the high input impedance terminating resistance (1 MΩ) is selected in the selection means (relay) 12, electric charge into the capacitance Cin is restrained and the dullness of the waveform is thus eliminated as has been described in the first and second embodiments, such that it is possible to faithfully observe an output waveform of a device under test with low load driving capability.

On the other hand, when the reference potential of the transmission line 11 is set to the guard potential, i.e., the potential at the guard line of the DC measurement interrupt path 14, the guard of the DC measurement interrupt path 14 as such is provided for leakage prevention, and therefore, the leakage can also be prevented in the envelope of the transmission line 11 connected to the guard.

While the preferred embodiments of the waveform input circuit, the waveform observation unit and the semiconductor test apparatus of the present invention have been described above, it goes without saying that the waveform observation unit and the semiconductor test apparatus according to the present invention are not exclusively limited to the embodiments described above, and various modifications can be made within the scope of the present invention.

For example, the waveform input circuit to which the DC measurement interrupt path is connected has been described in the first and second embodiments, but the invention can also be applied to embodiments of the waveform input circuit to which the DC measurement interrupt path is not connected.

Furthermore, in FIG. 6 to explain the waveform input circuit in the second embodiment described above, the reference potential switch means 16b of the input signal transmission lines is only connected to one transmission line, but the reference potential switch means 16b of the input signal transmission lines is not limited to one transmission line and can also be connected to two or more transmission lines.

Still further, in FIG. 6, the envelopes of a plurality of transmission lines 11 can be connected to the common terminal C of the reference potential switch means 16b of one input signal transmission line.

It is to be noted that the waveform input circuit, the waveform observation unit and the semiconductor test apparatus of the present invention may include an arbitrary combination of any of the waveform input circuits, waveform observation units and semiconductor test apparatuses in the first, second and third embodiments.

The present invention relates to a waveform input circuit and a waveform observation unit for observation of an analog signal waveform output from a device under test, and can therefore be used for a semiconductor test apparatus comprising the waveform input circuit and the waveform observation unit.

What is claimed is:

1. A waveform input circuit, comprising:
   an input signal transmission line having a predetermined characteristic impedance to receive a signal from a device under test at one end and outputs the signal at another end;
   an input buffer connected to said another end of the input signal transmission line to receive the signal from the device under test as an input signal;
   a high input impedance terminating resistance connected to an input terminal of the input buffer;
   a low input terminating resistance connected to the input terminal of the input buffer where the low input terminating resistance is impedance-matched with the characteristic impedance of the input signal transmission line;
   selection means for selecting one of the high input and low input terminating resistances;
   switch means for supplying one of at least two different reference potentials to the input signal transmission line; and an envelope drive amplifier connected between the input buffer and the switch means to provide one reference potential which is responsive to an output potential of the input buffer to an envelope of the input signal transmission line through the switch means;

wherein said envelope is an outer conductor of the input signal transmission line, and said signal from the device under test is transmitted through an inner conductor of the input signal transmission line; and wherein said one reference potential switched by the switch means is an in phase potential which is a potential controlled to be in phase with the input signal by an output voltage of the input buffer which is connected when the high input impedance terminating resistance is selected in the selection means.

2. The waveform input circuit according to claim 1, further comprising:

a DC measurement interrupt path connected to said another end of the input signal transmission line when to perform a DC measurement, wherein another reference potential which is switched by the switch means is a guard potential which is a potential at a guard line of the DC measurement interrupt path.

3. The waveform input circuit according to claim 1, further comprising:

a plurality of input signal transmission lines each having a predetermined characteristic impedance to receive a signal from a device under test at one end and outputs the signal at another end, wherein the switch means provides at least two reference potentials of different potentials to the corresponding input signal transmission lines.

4. A waveform observation unit for observing a waveform from a device, comprising:

a waveform input circuit to which an analog waveform output from a device under test is input via an input signal transmission line;

an A/D converter which converts the analog waveform into digital data; and a waveform acquisition memory which records the digital data, wherein the waveform input circuit, comprising:

an input signal transmission line having a predetermined characteristic impedance to receive a signal from a device under test at one end and outputs the signal at another end;

an input buffer connected to said another end of the input signal transmission line to receive the signal from the device under test as an input signal;

a high input impedance terminating resistance connected to an input terminal of the input buffer;

a low input terminating resistance connected to the input terminal of the input buffer where the low input terminating resistance is impedance-matched with the characteristic impedance of the input signal transmission line;

selection means for selecting one of the high input and low input terminating resistances;

switch means for supplying one of at least two different reference potentials to the input signal transmission line; and an envelope drive amplifier connected between the input buffer and the switch means to provide one reference potential which is responsive to an output potential of the input buffer to an envelope of the input signal transmission line through the switch means;

wherein said envelope is an outer conductor of the input signal transmission line, and said signal from the device under test is transmitted through an inner conductor of the input signal transmission line; and wherein said one reference potential switched by the switch means is an in phase potential which is a potential controlled to be in phase with the input signal by an output voltage of the input buffer which is connected when the high input impedance terminating resistance is selected in the selection means.

5. A semiconductor test apparatus comprising a waveform observation unit to observe an analog waveform output from a device under test, wherein the waveform observation unit comprises:

a waveform input circuit to which an analog waveform output from a device under test is input via an input signal transmission line;

an A/D converter which converts the analog waveform into digital data; and a waveform acquisition memory which records the digital data;

wherein the waveform input circuit comprising:

an input signal transmission line having a predetermined characteristic impedance to receive a signal from a device under test at one end and outputs the signal at another end;

an input buffer connected to said another end of the input signal transmission line to receive the signal from the device under test as an input signal;

a high input impedance terminating resistance connected to an input terminal of the input buffer;

a low input terminating resistance connected to the input terminal of the input buffer where the low input terminating resistance is impedance-matched with the characteristic impedance of the input signal transmission line;

selection means for selecting one of the high input and low input terminating resistances;

switch means for supplying one of at least two different reference potentials to the input signal transmission line; and an envelope drive amplifier connected between the input buffer and the switch means to provide one reference potential which is responsive to an output potential of the input buffer to an envelope of the input signal transmission line through the switch means;

wherein said envelope is an outer conductor of the input signal transmission line, and said signal from the device under test is transmitted through an inner conductor of the input signal transmission line; and wherein said one reference potential switched by the switch means is an in phase potential which is a potential controlled to be in phase with the input signal by an output voltage of the input buffer which is connected when the high input impedance terminating resistance is selected in the selection means.

* * * * *